(12) United States Patent
Kang

(10) Patent No.: US 7,642,892 B1
(45) Date of Patent: Jan. 5, 2010

(54) NEGATIVE VOLTAGE COEFFICIENT RESISTOR AND METHOD OF MANUFACTURE

(75) Inventor: Soon Won Kang, San Jose, CA (US)

(73) Assignee: Integrated Device Technology, Inc., San Jose, CA (US)

(*) Notice: Subject to any disclaimer, the term of this patent is extended or adjusted under 35 U.S.C. 154(b) by 635 days.

(21) Appl. No.: 11/373,374

(22) Filed: Mar. 10, 2006

(51) Int. Cl.
H01C 7/00 (2006.01)

(52) U.S. Cl. .............................. 338/21; 338/9; 438/246

(58) Field of Classification Search ............. 338/21, 338/7–9; 438/210, 239, 246, 247; 29/610.1, 29/576 B
See application file for complete search history.

(56) References Cited

U.S. PATENT DOCUMENTS

| 4,208,781 | A | 6/1980 | Rao et al. | |
|---|---|---|---|---|
| 4,383,237 | A * | 5/1983 | Eda et al. | 338/21 |
| 4,467,519 | A | 8/1984 | Glang et al. | |
| 6,204,105 | B1 * | 3/2001 | Jung | 438/238 |
| 6,400,252 | B1 | 6/2002 | Smith et al. | |
| 6,784,048 | B2 * | 8/2004 | Leung et al. | 438/239 |
| 6,960,979 | B2 | 11/2005 | Banerjee | |
| 2001/0046742 | A1 * | 11/2001 | Jeng | 438/287 |
| 2003/0139061 | A1 * | 7/2003 | Jeng et al. | 438/775 |
| 2006/0035426 | A1 | 2/2006 | Weiss et al. | |

* cited by examiner

Primary Examiner—Kyung Lee
(74) Attorney, Agent, or Firm—Glass & Associates; Molly Sauter; Kenneth Glass

(57) ABSTRACT

In one aspect, a negative voltage coefficient resistor is provided. The negative voltage coefficient resistor includes an insulative layer positioned between a polycrystalline silicon resistive layer and a silicide layer. Upon application of an appropriate voltage bias at the silicide layer of the resistor, a tunneling current is established across the insulative layer and is supplied to the polycrystalline silicon resistive layer. The tunneling current limits the current flow through the polycrystalline silicon layer, producing a resistor having a negative voltage coefficient of resistance and a reduced temperature coefficient of resistance.

16 Claims, 3 Drawing Sheets

NEGATIVE VOLTAGE COEFFICIENT RESISTOR AND METHOD OF MANUFACTURE

BACKGROUND OF THE INVENTION

Polycrystalline silicon, also known as polysilicon, poly-Si or poly, is widely used to form MOS transistor gate electrodes and form interconnections in MOS circuits. Additionally, doped polysilicon can be used to form a resistive element for an integrated circuit. In particular, a polycide resistor is formed of polycrystalline silicon with a layer of silicide positioned on top of the polycrystalline silicon layer. Often the polycrystalline silicon layer is doped with a dopant material to achieve a desired resistance value. The resistance of doped polysilicon is high and as such, it is commonly known in the art to provide a layer of silicide, such as tungsten silicide on top of the polysilicon resistive layer to reduce the overall resistance of the resistive element.

A voltage is provided across two contact points on the surface of the silicide layer to establish the resistor. The equivalent circuit for such a polycide resistor is two resistors in parallel, one representing the resistance through the silicide layer and the other representing the resistance through the polysilicon layer. It is known that the resistance of the polysilicon layer is much higher than the resistance of the silicide layer, and as such, the majority of the current in the circuit flows through the silicide layer. It has been shown that the conventional polycide resistor offers a positive voltage coefficient in the order of 20-200 ppm/V due to the inter-grain boundary resistance.

Fluctuations in the resistance value of polycide resistors occur in response to changes in temperature and applied voltage. The voltage coefficient of resistance (VCR) of a polycide resistor is a measurement of the change in resistance with applied voltage and is expressed as the rate of change in resistance value per 1 volt in the prescribed voltage range (ppm/V). One of the inherent characteristics of polycide resistors is the positive voltage coefficient of the resistor. The positive voltage coefficient results from the increase in the resistance value of the polycide resistor caused by a voltage drop within a grain of the polycrystalline layer, resulting in disruption of the inter-boundary depletion equilibrium. As such, the resistance value of a polycide resistor increases with an increase in applied voltage.

A temperature coefficient of resistance (TCR) is expressed as the change in resistance of a resistor in parts per million for each degree of change in temperature (ppm/° C.). TCR is typically referenced from +25° C. and changes as the temperature increases or decreases. Polycide resistors are known to exhibit a positive temperature coefficient of resistance, such that their resistance value increases with an increase in temperature.

Resistors are used in all analog and mixed-signal circuits. A wide variety of polysilicon resistors utilizing CMOS technologies are available to accommodate the needs of the circuit designer. Figures of merit for resistors include the voltage coefficients of resistance and the temperature coefficient of resistance for the resistor. In the design of such integrated circuits, it is often important to be able to reduce the variation in the resistance value of the resistors over the operational voltage and temperature range. As such, for integrated circuits employing polysilicon resistors it is desirable to have a means of compensating for the positive voltage coefficient and positive temperature coefficient that are inherent characteristics of polysilicon resistors within an integrated circuit design.

SUMMARY OF THE INVENTION

In accordance with the present invention, a resistor having a negative voltage coefficient is attained by introducing an insulating layer such as silicon nitride or silicon dioxide between the polycrystalline silicon and the silicide of a polycide resistor. The insulating layer acts as a voltage-controlled current limiting source under an applied bias voltage. Due to the presence of the insulating layer between the polysilicon and the silicide, the localized tunneling current through the insulating layer dictates the current through the polysilicon layer. Since the magnitude of the tunneling current is determined by and is proportional to the applied bias, the tunneling current is dominant over the inherent characteristics of the polycrystalline silicon and as such a negative voltage coefficient is attained.

The present invention provides a negative voltage coefficient resistor that includes a polycrystalline silicon resistive layer, an electrically insulative layer, and a silicide layer. The insulative layer is positioned between the polycrystalline silicon layer and the silicide layer. Two electrical contact regions are in circuit communication with the silicide layer and are separated from each other such that a negative voltage coefficient resistor is established between the two electrical contact regions. The insulative layer has a layer thickness and a material composition such that a voltage bias applied between the two electrical contact regions can establish a tunneling current in the insulative layer that limits the current flow through the polycrystalline silicon resistive layer.

The two electrical contact regions in contact with the silicide layer are used to provide a bias voltage supply to the resistor. This bias voltage determines the current flow through the resistor. In accordance with the present invention, the bias voltage is sufficient to establish a tunneling current through the insulative layer. This tunneling current then limits the current flowing through the polysilicon resistive layer, thereby establishing a negative voltage coefficient for the resistor device.

In an additional embodiment, a method of limiting the current flow through a polycrystalline silicon layer of a polycide resistor is disclosed in which an insulative layer is positioned between a polycrystalline silicon resistive layer and a silicide layer of a polycide resistor, and applying a voltage bias at the silicide layer, the voltage bias sufficient to establish a tunneling current across the insulative layer that limits the current flow through the polycrystalline silicon layer of the resistor.

In an additional embodiment of the invention, a method of forming a negative voltage coefficient resistor is provided. The method includes forming a polycrystalline silicon resistive layer and forming a voltage-controlled current limiting insulative layer overlying and in direct contact with the polycrystalline silicon layer. A silicide layer is then formed that overlies and is in direct contact with the voltage-controlled current limiting insulative layer. Two electrical contact regions are formed in circuit communication with the silicide layer and separated from each other such that a negative voltage coefficient resistor is established between the two electrical contact regions.

Since the current flow through the polysilicon resistor of the present invention is dictated by the voltage-controlled current limiting insulative layer, the method and apparatus of the present invention result in a resistor having a negative voltage coefficient of resistance and a reduced temperature coefficient of resistance.

The present invention is advantageous because it provides a negative voltage coefficient resistor compatible with CMOS integrated circuit fabrication processes that has a negative voltage coefficient of resistance and a reduced temperature coefficient of resistance which may be used to compensate for positive voltage coefficient and positive temperature coefficient resistors within the CMOS design. Other objects and advantages of the invention will become apparent upon reading the following detailed description and upon reference to the accompanying drawings.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
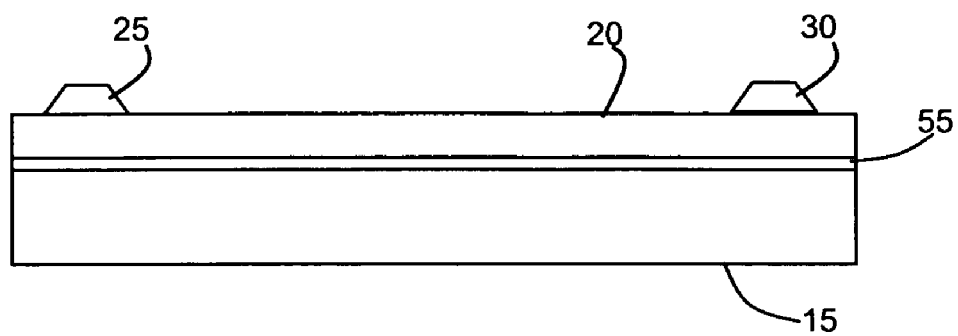
FIG. 1 is a diagrammatic view of a negative voltage coefficient resistor having a voltage-controlled current limiting insulative layer in accordance with an embodiment of the present invention.
Figure 2:
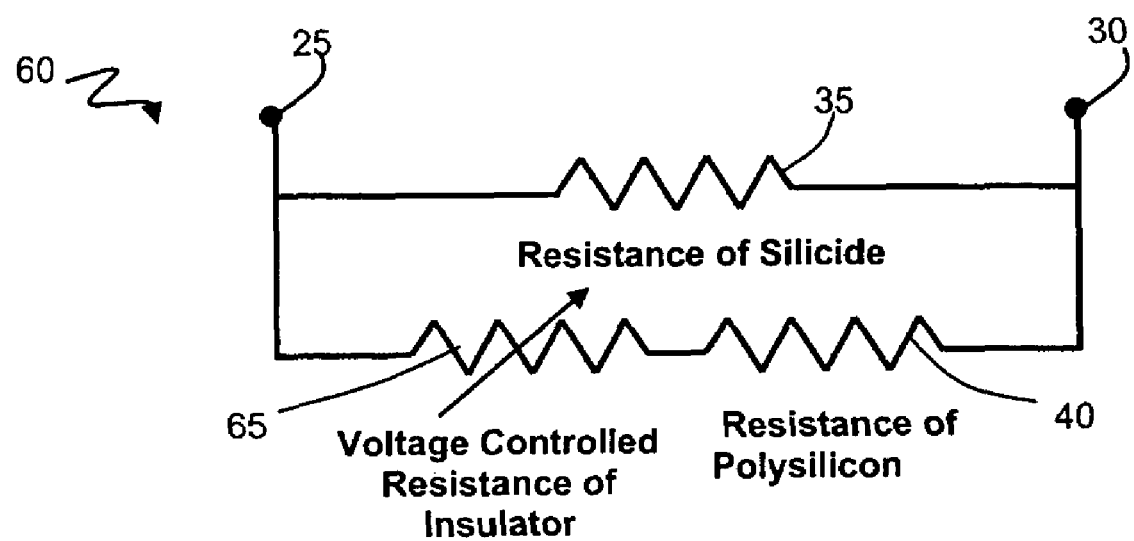
FIG. 2 is an illustration of the equivalent of the negative voltage coefficient resistor of FIG. 1 in accordance with an embodiment of the present invention.

With reference to FIG. 1, a negative voltage coefficient resistor 50 is shown that includes a voltage-controlled current limiting insulative layer 55 between silicide layer 20 and polycrystalline silicon layer 15. Contacts 25 and 30 are electrically connected to silicide layer 20.

In the present embodiment polycrystalline silicon layer 15 extends over a semiconductor substrate and insulative layer 55 extends immediately over, and in direct contact with polycrystalline silicon layer 15. In this embodiment silicide 20 extends immediately over and is in direct contact with insulative layer 55. Insulative layer 15 has a layer thickness and a material composition such that a voltage bias applied between the electrical contacts 25 and 30, that is within the normal operating voltage range of the semiconductor device, can establish a tunneling current in the insulative layer 55. This limits the current flow through polycrystalline silicon resistive layer 15.

Due to the presence of insulative layer 55, the current through polycrystalline silicon layer 15 is predominantly determined by the localized tunneling current (either direct tunneling or Fowler-Nordheim tunneling). In general terms, tunneling is the process whereby electrons tunnel through a barrier in the presence of a high electric field.

The current density flowing through the thin insulative layer due to Fowler Nordheim Tunneling is a function of the electric field across the insulative layer. The electric field is the voltage divided by the distance across the insulative layer. As such, the magnitude of the tunneling current is proportional to the bias applied to the resistor and the thickness of the insulative layer, having an empirical relation such as:

Tunneling Current~Constant×(Applied Bias/Insulative Layer Thickness)^2×exp(−Constant×Insulative Layer Thickness/Applied Bias)

Figure 3:
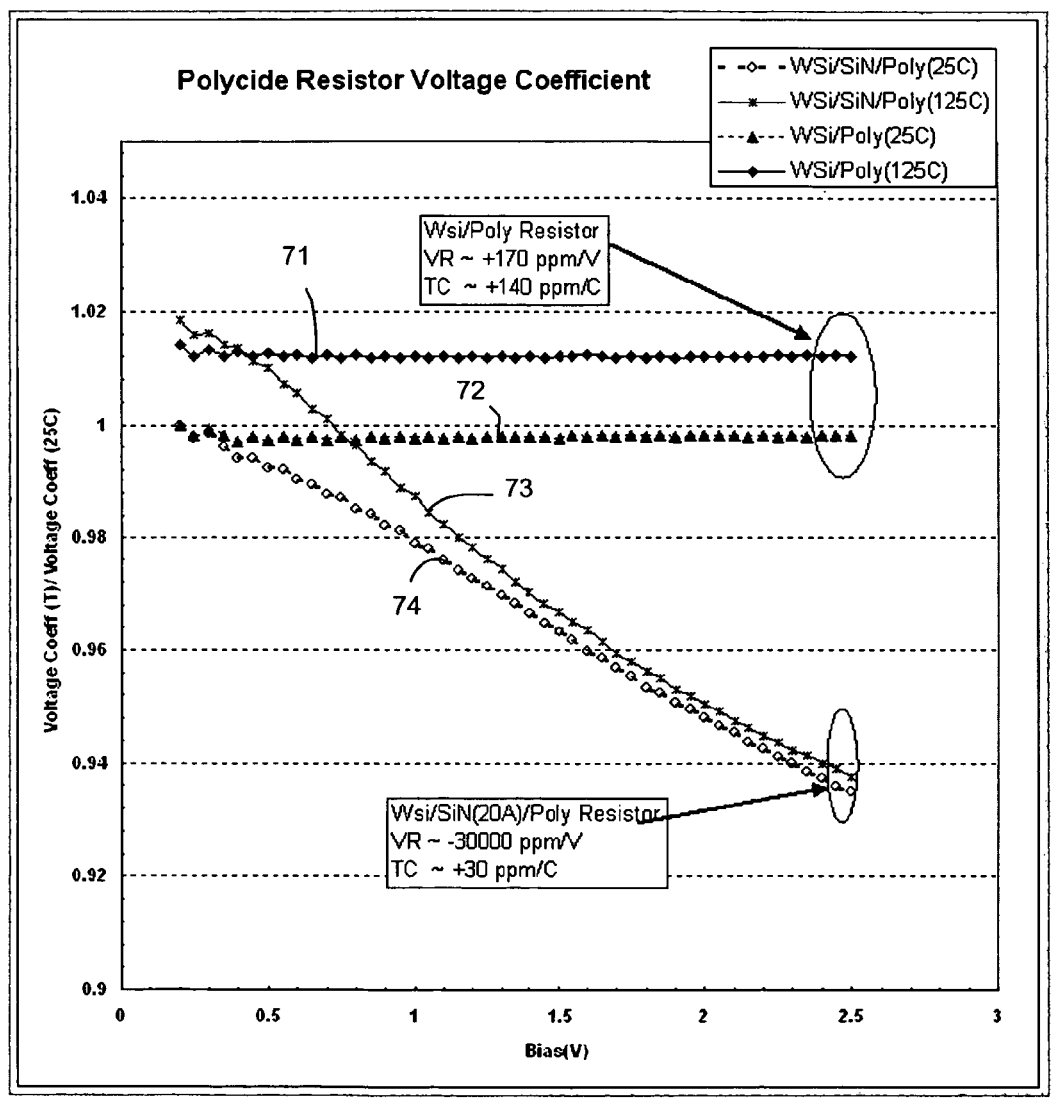
FIG. 3 is a graphical illustration of the voltage coefficient of resistance for the negative voltage coefficient resistor in accordance with an embodiment of the present invention.

Referring now to FIG. 3, an equivalent circuit model of the resistor 60 is shown in which the resistance of the silicide is represented by resistor 35 and the equivalent circuit for insulative layer 55 is modeled with a lump voltage-controlled resistor 65 in series with the equivalent resistor 40 that represents the resistance of polycrystalline silicon layer 15. As such, the tunneling current through voltage-controlled resistor 65 limits the current supplied to the resistor 40, resulting in a negative voltage coefficient for resistor 60.

In one embodiment of the present invention a negative voltage coefficient resistor 50 is formed in accordance with the following process steps. First, a polycrystalline silicon resistive layer is formed. The polycrystalline silicon resistive layer can be formed by depositing one or more layer of polycrystalline silicon on a semiconductor substrate. In the present embodiment a single layer of polycrystalline silicon is deposited having a thickness of approximately 1000 Å. In one embodiment the polycrystalline silicon layer is doped by performing one or more implant process steps so as to achieve the desired electrical resistance. In a specific embodiment, the polysilicon layer is doped to establish an N+ doped polycrystalline silicon resistive layer. Alternatively, undoped polycrystalline silicon can be used. In one embodiment the polysilicon layer is the same layer that is used for forming gate electrodes and local interconnects of a CMOS integrated circuit device formed on a semiconductor substrate.

A voltage-controlled current limiting insulative layer is then formed. In the present embodiment a voltage-controlled insulative layer 55 is formed by depositing one or more layer of material immediately over, and in direct contact with the polycrystalline silicon layer. The composition and thickness of the deposited insulative layer is such that charge tunneling can occur in the insulative layer during normal operation of the integrated circuit device. This potential for charge tunneling gives the insulative layer voltage-controlled, current limiting properties. More particularly, when a sufficient voltage is applied, charge tunneling will occur, limiting the current passing through polycrystalline silicon layer 15.

In the present embodiment a voltage-controlled current limiting insulative layer 55 is formed by depositing a layer of silicon nitride immediately over, and in direct contact with the polycrystalline silicon layer. The thickness of the silicon nitride layer is such that charge tunneling can occur when a voltage is applied to the resistor that is within the normal operating voltage range of the semiconductor device. In one embodiment in which the normal operating voltage range of the integrated circuit device is between 0 Volts and 2.5 Volts, a voltage-controlled current limiting insulative layer is formed by depositing a layer of silicon nitride, having a thickness of between 20 Å and 30 Å, using a Plasma Enhanced Chemical Vapor Deposition (PECVD) process. In one specific embodiment the layer of silicon nitride has a thickness of between about 25 Å and 30 Å. In another embodiment the resistive layer is one or more layer of silicon dioxide, immediately over, and in direct contact with the polycrystalline layer. Alternatively, other types of materials can be used such as, for example, silicon oxynitride.

A silicide layer is then formed over the insulative layer. In the present embodiment the silicide layer is one or more layer of silicide formed immediately over, and in direct contact with the insulative layer. The silicide layer can be formed of one or more layers of refractory metal silicide, with individual layers formed of cobalt silicide, tungsten silicide, titanium silicide, tantalum silicide, molybdeum silicide, niobium silicide, rhenium silicide, vanadium silicide, chromium silicide, zirconium silicide or hafnium silicide. The silicide layer can also be formed using non-refractory-metal silicides, or nonmetal silicides that have sufficient conductivity. In the present embodiment silicide layer 20 is formed using a Chemical Vapor Deposition (CVD) process to deposit a single layer of tungsten silicide ($WSi_x$) having a thickness of approximately 500 Å.

Mask and etch steps are performed so as to pattern polycrystalline silicon layer 15, insulative layer 55 and silicide layer 20. It is appreciated that polycrystalline silicon layer 15, insulative layer 55 and silicide layer 20 can be patterned at the same time or can be patterned separately. In one embodiment polycrystalline silicon layer 15 is patterned using a first set of mask and etch steps that are performed prior to deposition of insulative layer 55 and insulative layer 55 and silicide layer 20 are patterned using a second set of mask and etch steps.

Electrical contact regions are formed in circuit communication with the silicide layer and separated from each other such that a negative voltage coefficient resistor is established between the two electrical contact regions. These electrical contact regions can be interconnects, plugs or any other electrically conductive structure that can be used to apply a voltage differential to silicide layer 20. In one embodiment electrical contacts 25 and 30 are formed by depositing and patterning a layer of metal.

It is envisioned that the negative voltage coefficient resistor of the present invention is part of an integrated circuit and as such is formed utilizing standard CMOS technology during the fabrication of the integrated circuit.

Referring now to FIG. 3, a graph illustrating the voltage coefficient of resistance for a polycide resistor as is known in the art as compared to the negative voltage coefficient resistor of the present invention. More particularly, line 71 shows the voltage coefficient of a conventional, prior art, tungsten silicide polycide resistor at 125° C. and line 72 shows the voltage coefficient of a conventional, prior art, tungsten silicide polycide resistor at 25° C. Line 73 shows the voltage coefficient of a tungsten silicide negative coefficient resistor in accordance with the present invention at 125° C. and line 74 shows the voltage coefficient of a tungsten silicide negative coefficient resistor in accordance with the present invention at 25° C. From the graph, it can be seen that the voltage coefficient of resistance for a conventional, prior art, polycide resistor (WSi/Poly Resistor) 70 is about +170 ppm/V and the temperature coefficient of resistance for a conventional polycide resistor is about +140 ppm/° C. By contrast, the voltage coefficient of resistance of the negative voltage coefficient resistor in accordance with the present invention (WSi/SiN/Poly Resistor) 75 is approximately −30000 ppm/V and the temperature coefficient of resistance for the negative voltage coefficient resistor in accordance with the present invention is about +30 ppm/° C. As such, the graph illustrates the negative voltage coefficient of resistance and the reduced temperature coefficient attainable with the negative voltage coefficient resistor in accordance with the present invention.

While various materials and layer thicknesses are encompassed by the present invention, a particular embodiment of the negative voltage coefficient resistor in accordance with the present invention includes a N+ doped polysilicon layer of about 1000 Å, a silicon nitride insulative layer of less than 30 Å and a tungsten silicide layer of about 500 Å.

The negative voltage coefficient resistor of the present invention can be employed in logic and analog circuit designs where a resistor with a negative voltage coefficient is needed to compensate for a resistor having a positive voltage coefficient in the circuit design.

Although specific embodiments of the invention have been disclosed, it will be understood by those having ordinary skill in the art that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. A negative voltage coefficient resistor comprising:
   a polycrystalline silicon resistive layer;
   a silicide layer positioned overlying the polycrystalline silicon resistive layer;
   two electrical contact regions in circuit communication with the silicide layer and separated from each other; and
   an electrically insulative layer positioned between the polycrystalline silicon layer and the silicide layer, the insulative layer having a layer thickness and a material composition such that a voltage bias applied between the two electrical contact regions can establish a tunneling current in the insulative layer that limits the current flow through the polycrystalline silicon resistive layer.

2. The negative voltage coefficient resistor of claim 1, wherein the silicide layer is positioned immediately above and in direct contact with the insulative layer and wherein the polycrystalline silicon resistive layer is doped with dopants to achieve a desired electrical resistance of the negative voltage coefficient resistor.

3. The negative voltage coefficient resistor of claim 1, wherein the insulative layer is composed of silicon dioxide.

4. The negative voltage coefficient resistor of claim 1, wherein the insulative layer is composed of silicon nitride.

5. The negative voltage coefficient resistor of claim 4, wherein the silicon nitride layer has a thickness of between about 25 Å and about 30 Å.

6. The negative voltage coefficient resistor of claim 1, wherein the insulative layer is characterized as an electron-tunneling layer.

7. The negative voltage coefficient resistor of claim 1 further comprising a bias voltage supply positioned to establish a bias voltage between the two electrical contact regions, wherein the bias voltage is sufficient to establish a tunneling current in the voltage-controlled current limiting insulative layer.

8. The negative voltage coefficient resistor of claim 7, wherein the tunneling current in the insulative layer determines the current flow through the polycrystalline silicon layer, the current flow through the polycrystalline silicon layer limited by the tunneling current of the insulative layer.

9. The negative voltage coefficient resistor of claim 1, wherein the silicide layer is tungsten silicide having a layer thickness of about 500 Å.

10. A method for limiting the current flow through a polycrystalline silicon layer of a polycide resistor, the method comprising the steps of:
   positioning an insulative layer between a polycrystalline silicon resistive layer and a silicide layer of a polycide resistor; and
   applying a voltage bias at the silicide layer, the voltage bias sufficient to establish a tunneling current across the insulative layer that limits the current flow through the polycrystalline silicon resistive layer.

11. The method of claim 10, wherein the step of positioning an insulative layer between a polycrystalline silicon resistive layer and a silicide layer of a polycide resistor further comprises the step of forming a polycrystalline silicon resistive layer on a substrate.

12. The method of claim 10, further comprising the step of doping the polycrystalline silicon resistive layer with at least one dopant to achieve a desired electrical resistance.

13. The method of claim 12, further comprising the step of doping the polycrystalline silicon resistive layer with a dopant to achieve an N+ doped polycrystalline layer.

14. The method of claim 10, wherein the step of positioning an insulative layer between a polycrystalline silicon resistive layer and a silicide layer further comprises:
   forming an insulative layer overlying and in direct contact with the polycrystalline silicon resistive layer; and
   forming a silicide layer overlying and in direct contact with the insulative layer.

15. The method of claim 14, wherein the insulative layer is silicon nitride having a thickness of between about 25 Å and about 30 Å.

16. The method of claim 10, wherein the insulative layer is silicon dioxide.

* * * * *